United States Patent
Xie et al.

(10) Patent No.: US 11,201,176 B2
(45) Date of Patent: Dec. 14, 2021

(54) ARRAY SUBSTRATE, DISPLAY APPARATUS, AND METHOD OF FABRICATING ARRAY SUBSTRATE

(71) Applicant: BOE TECHNOLOGY GROUP CO., LTD., Beijing (CN)

(72) Inventors: Dini Xie, Beijing (CN); Wei Li, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 760 days.

(21) Appl. No.: 16/070,098

(22) PCT Filed: Aug. 8, 2017

(86) PCT No.: PCT/CN2017/096409
§ 371 (c)(1),
(2) Date: Jul. 13, 2018

(87) PCT Pub. No.: WO2019/028670
PCT Pub. Date: Feb. 14, 2019

(65) Prior Publication Data
US 2021/0217778 A1 Jul. 15, 2021

(51) Int. Cl.
*H01L 27/12* (2006.01)
*H01L 29/786* (2006.01)

(52) U.S. Cl.
CPC ...... *H01L 27/1244* (2013.01); *H01L 27/1259* (2013.01); *H01L 29/78633* (2013.01); *H01L 27/1225* (2013.01); *H01L 29/7869* (2013.01)

(58) Field of Classification Search
None
See application file for complete search history.

(56) References Cited

U.S. PATENT DOCUMENTS

| | | |
|---|---|---|
| 2005/0253991 A1 | 11/2005 | Chang |
| 2007/0109454 A1 | 5/2007 | Chou |
| 2008/0135909 A1 | 6/2008 | Takeguchi et al. |
| 2008/0170013 A1* | 7/2008 | Jeong ............ H01L 27/0248 345/82 |
| 2015/0062511 A1 | 3/2015 | Shin et al. |
| 2017/0176826 A1 | 6/2017 | Tsuda et al. |

FOREIGN PATENT DOCUMENTS

| | | |
|---|---|---|
| CN | 101196668 A | 6/2008 |
| CN | 104423112 A | 3/2015 |
| CN | 106990627 A | 7/2017 |
| JP | 2005303220 A | 10/2005 |

OTHER PUBLICATIONS

International Search Report & Written Opinion dated May 8, 2018, regarding PCT/CN2017/096409.

* cited by examiner

*Primary Examiner* — Bo B Jang
(74) *Attorney, Agent, or Firm* — Intellectual Valley Law, P.C.

(57) ABSTRACT

The present application discloses an array substrate having a plurality of thin film transistors, a display apparatus, and a method of fabricating an array substrate. The array substrate includes a base substrate; a semiconductor layer on the base substrate and including a plurality of active layers respectively for the plurality of thin film transistors; and an electrostatic discharging layer electrically connected to the semiconductor layer and configured to discharge electrostatic charge in the semiconductor layer.

14 Claims, 4 Drawing Sheets

ARRAY SUBSTRATE, DISPLAY APPARATUS, AND METHOD OF FABRICATING ARRAY SUBSTRATE

CROSS-REFERENCE TO RELATED APPLICATION

This application is a national stage application under 35 U.S.C. § 371 of International Application No. PCT/CN2017/096409, filed Aug. 8, 2017, the contents of which are incorporated by reference in the entirety.

TECHNICAL FIELD

The present invention relates to display technology, more particularly, to a array substrate, a display apparatus, and a method of fabricating an array substrate.

BACKGROUND

Display apparatuses such as liquid crystal display (LCD) apparatuses and organic light-emitting diode (OLED) display apparatuses have been widely used. LCD and OLED display apparatuses use thin film transistor (TFT) to control pixels in the display apparatuses. Examples of TFT include amorphous silicon TFT, polycrystalline silicon TFT, single crystal silicon TFT, metal oxide TFT, as well as organic semiconductor TFT.

SUMMARY

In one aspect, the present invention provides an array substrate having a plurality of thin film transistors, comprising a base substrate; a semiconductor layer on the base substrate and comprising a plurality of active layers respectively for the plurality of thin film transistors; and an electrostatic discharging layer electrically connected to the semiconductor layer and configured to discharge electrostatic charge in the semiconductor layer.

Optionally, the electrostatic discharging layer comprises a plurality of electrostatic discharging blocks; and each of the plurality of active layers is electrically connected to one of the plurality of electrostatic discharging blocks.

Optionally, the array substrate further comprises an insulating layer between the semiconductor layer and the electrostatic discharging layer; wherein each of the plurality of active layers is electrically connected to one of the plurality of electrostatic discharging blocks through a via extending through the insulating layer.

Optionally, each of the plurality of active layers comprises a channel region, a source electrode contact region, and a drain electrode contact region; wherein each of the plurality of electrostatic discharging blocks is electrically connected to a region in one of the plurality of active layers that is outside the channel region.

Optionally, a projection of each of the plurality of electrostatic discharging blocks on the base substrate substantially covers a projection of the channel region in one of the plurality of active layers on the base substrate.

Optionally, each of the plurality of electrostatic discharging blocks is a light shielding layer for shielding the channel region in one of the plurality of active layers from light.

Optionally, the array substrate further comprises a gate insulating layer on a side of the semiconductor layer distal to the base substrate; and a gate electrode layer on a side of the gate insulating layer distal to the semiconductor layer; wherein the insulating layer is on a side of the semiconductor layer proximal to the base substrate; and the electrostatic discharging layer is on a side of the insulating layer proximal to the base substrate.

Optionally, the array substrate further comprises an interlayer dielectric layer on a side of the gate electrode layer distal to the semiconductor layer; and a source-drain electrode layer on a side of the interlayer dielectric layer distal to the base substrate; wherein the source-drain electrode layer comprises a plurality of source electrodes respectively for the plurality of thin film transistors and a plurality of drain electrodes respectively for the plurality of thin film transistors; each of the plurality of source electrodes is electrically connected to one of the plurality of active layers; and each of the plurality of drain electrodes is electrically connected to one of the plurality of active layers.

Optionally, the electrostatic discharging layer comprises a metal or alloy.

Optionally, the electrostatic discharging layer is in a display area of the array substrate.

In another aspect, the present invention provides a display apparatus comprising the array substrate described herein or fabricated by a method described herein.

In another aspect, the present invention provides a method of fabricating an array substrate having a plurality of thin film transistors, comprising forming a semiconductor layer on the base substrate, the semiconductor layer being formed to comprise a plurality of active layers respectively for the plurality of thin film transistors; and forming an electrostatic discharging layer electrically connected to the semiconductor layer and configured to discharge electrostatic charge in the semiconductor layer.

Optionally, forming the electrostatic discharging layer comprises forming a plurality of electrostatic discharging blocks; and each of the plurality of active layers is formed to be electrically connected to one of the plurality of electrostatic discharging blocks.

Optionally, the method further comprises forming an insulating layer and forming a plurality of vias extending through the insulating layer; wherein the insulating layer is formed between the semiconductor layer and the electrostatic discharging layer; and each of the plurality of active layers is formed to be electrically connected to one of the plurality of electrostatic discharging blocks through one of the plurality of vias extending through the insulating layer.

Optionally, each of the plurality of active layers is formed to comprise a channel region, a source electrode contact region, and a drain electrode contact region; and each of the plurality of electrostatic discharging blocks is electrically connected to a region in one of the plurality of active layers that is outside the channel region.

Optionally, the electrostatic discharging layer is formed so that a projection of each of the plurality of electrostatic discharging blocks on the base substrate substantially covers a projection of the channel region in one of the plurality of active layers on the base substrate.

Optionally, the electrostatic discharging layer is made of a light shield material for shielding the channel region in one of the plurality of active layers from light.

Optionally, the method further comprises forming a gate insulating layer on a side of the semiconductor layer distal to the base substrate; and forming a gate electrode layer on a side of the gate insulating layer distal to the semiconductor layer; wherein the insulating layer is formed on a side of the semiconductor layer proximal to the base substrate; and the electrostatic discharging layer is formed on a side of the insulating layer proximal to the base substrate.

Optionally, the method further comprises forming an interlayer dielectric layer on a side of the gate electrode layer distal to the semiconductor layer; and forming a source-drain electrode layer on a side of the interlayer dielectric layer distal to the base substrate; wherein the source-drain electrode layer is formed to comprise a plurality of source electrodes respectively for the plurality of thin film transistors and a plurality of drain electrodes respectively for the plurality of thin film transistors; each of the plurality of source electrodes is formed to be electrically connected to one of the plurality of active layers; and each of the plurality of drain electrodes is formed to be electrically connected to one of the plurality of active layers.

Optionally, the electrostatic discharging layer is made of a metal or alloy.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Fabrication of an array substrate often includes one or more photoresist lithography processes. During the photoresist lithography processes, UV irradiation often generates electrostatic charges in the array substrate to be formed. It was discovered in the present disclosure that electrostatic charges may be generated and accumulated in an active layer of a thin film transistor in the array substrate to be formed. When the electrostatic charges in the active layer accumulate to a certain level, they are often discharged to nearby metallic signal lines such as a gate line, resulting in damages to these signal lines and the active layer itself.

Accordingly, the present disclosure provides, inter alia, an array substrate, a display apparatus, and a method of fabricating an array substrate that substantially obviate one or more of the problems due to limitations and disadvantages of the related art. In one aspect, the present disclosure provides an array substrate having a plurality of thin film transistors. In some embodiments, the array substrate includes a base substrate; a semiconductor layer on the base substrate and including a plurality of active layers respectively for the plurality of thin film transistors; and an electrostatic discharging layer configured to discharge electrostatic charge in the semiconductor layer.

Figure 1:
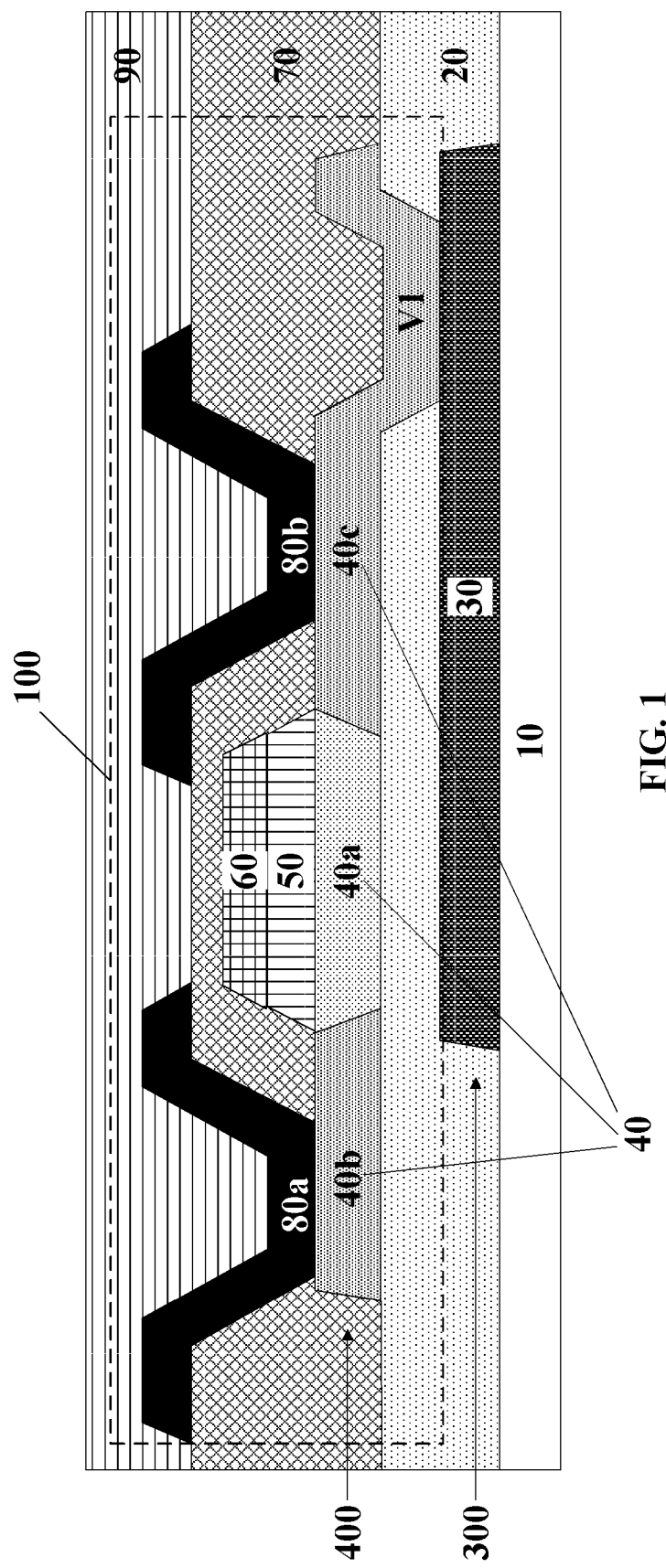
FIG. 1 is a schematic diagram illustrating the structure of an array substrate in some embodiments according to the present disclosure.

FIG. 1 is a schematic diagram illustrating the structure of an array substrate in some embodiments according to the present disclosure. The array substrate includes a plurality of thin film transistors 100, one of the plurality of thin film transistors 100 is shown in FIG. 1. Referring to FIG. 1, the array substrate in some embodiments includes a base substrate 10, a semiconductor layer 400 on the base substrate 10, the semiconductor layer 400 includes a plurality of active layers 40 respectively for the plurality of thin film transistors 100. The array substrate further includes an electrostatic discharging layer 300 electrically connected to the semiconductor layer 400 and configured to discharge electrostatic charge in the semiconductor layer 400. As shown in FIG. 1, the electrostatic discharging layer 300 includes a plurality of electrostatic discharging blocks 30. Each of the plurality of active layers 40 in the plurality of thin film transistors 100 is electrically connected to one of the plurality of electrostatic discharging blocks 30. The electrostatic discharging layer 300 may be disposed in any appropriate position in the array substrate. In one example, the electrostatic discharging layer 300 is on a side of the semiconductor layer 400 distal to the base substrate 10. In another example, the electrostatic discharging layer 300 is on a side of the semiconductor layer 400 proximal to the base substrate 10. Optionally, the electrostatic discharging layer 300 and the semiconductor layer 400 are substantially on a same horizontal plane. Optionally, one or more of the plurality of electrostatic discharging blocks 30 is connected to ground. Optionally, one or more of the plurality of electrostatic discharging blocks 30 is floating.

Referring to FIG. 1, the array substrate in some embodiments further includes an insulating layer 20 between the semiconductor layer 400 and the electrostatic discharging layer 300. Optionally, each of the plurality of active layers 40 is electrically connected to one of the plurality of electrostatic discharging blocks 30 through a via V1 extending through the insulating layer 20. Optionally, semiconductor material of the semiconductor layer 400 fills in the via V1 and is in contact with the electrostatic discharging layer 300 underneath, thereby electrically connecting the semiconductor layer 400 to the electrostatic discharging layer 300.

Figure 2:
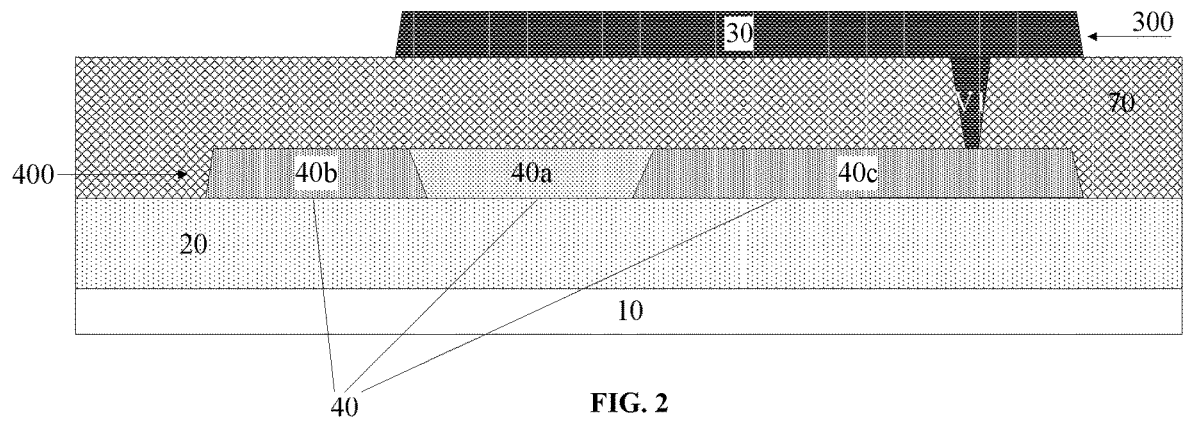
FIG. 2 is a schematic diagram illustrating a partial structure of an array substrate in some embodiments according to the present disclosure.

FIG. 2 is a schematic diagram illustrating a partial structure of an array substrate in some embodiments according to the present disclosure. Referring to FIG. 2, the electrostatic discharging layer 300 in some embodiments is on a side of the semiconductor layer 400 distal to the base substrate 10. The array substrate further includes an interlayer dielectric layer 70 between the semiconductor layer 400 and the electrostatic discharging layer 300. Each of the plurality of active layers 40 is electrically connected to one of the plurality of electrostatic discharging blocks 30 through a via V1 extending through the interlayer dielectric layer 70. Optionally, a conductive material of the electrostatic discharging layer 300 fills in the via V1 and is in contact with the semiconductor layer 400 underneath, thereby electrically connecting the semiconductor layer 400 to the electrostatic discharging layer 300.

Figure 3:
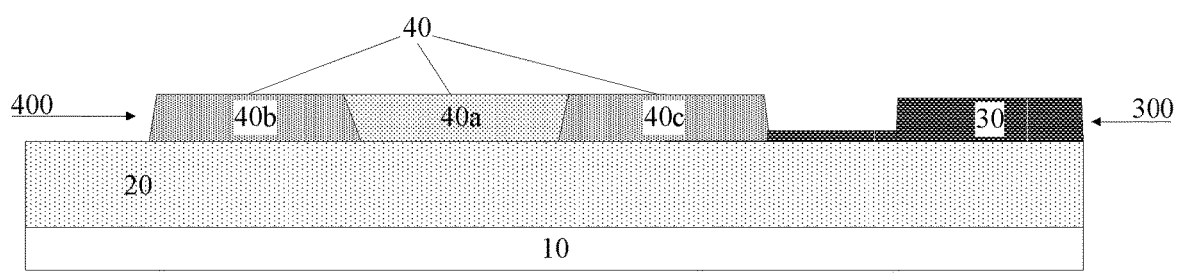
FIG. 3 is a schematic diagram illustrating a partial structure of an array substrate in some embodiments according to the present disclosure.

FIG. 3 is a schematic diagram illustrating a partial structure of an array substrate in some embodiments according to the present disclosure. Referring to FIG. 3, the semiconductor layer 400 and the electrostatic discharging layer 300 in some embodiments are substantially on a same horizontal plane, e.g., in contact with the surface of the insulating layer 20.

Referring to FIG. 1, each of the plurality of active layers 40 includes a channel region 40a, a source electrode contact region 40b, and a drain electrode contact region 40c. The electrostatic discharging layer 300 may be electrically connected to the semiconductor layer 400 at any appropriate position. Optionally, each of the plurality of electrostatic discharging blocks 30 is electrically connected to a region in one of the plurality of active layers 40 that is outside the channel region 40a. In one example, each of the plurality of electrostatic discharging blocks 30 is electrically connected to the source electrode contact region 40b in one of the plurality of active layers 40. In one example, each of the plurality of electrostatic discharging blocks 30 is electrically connected to the drain electrode contact region 40c in one of the plurality of active layers 40.

In some embodiments, the electrostatic discharging layer 300 is disposed in an inter-subpixel region of the array substrate. As used herein, an inter-subpixel region refers to a region between adjacent subpixel regions, such as a region corresponding to a black matrix in a liquid crystal display or a region corresponding a pixel definition layer in an organic light emitting diode display panel. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel. As used herein, a subpixel region refers to a light emission region of a subpixel, such as a region corresponding to a pixel electrode in a liquid crystal display or a region corresponding to a light emissive layer in an organic light emitting diode display panel. Optionally, a pixel may include a number of separate light emission regions corresponding to a number of subpixels in the pixel. Optionally, the subpixel region is a light emission region of a red color subpixel. Optionally, the subpixel region is a light emission region of a green color subpixel. Optionally, the subpixel region is a light emission region of a blue color subpixel. Optionally, the subpixel region is a light emission region of a white color subpixel.

In some embodiments, a projection of each of the plurality of electrostatic discharging blocks 30 on the base substrate 10 substantially covers a projection of the channel region 40a in one of the plurality of active layers 40 on the base substrate 10. In some embodiments, the electrostatic discharging layer 300 also functions as a light shielding layer configured to shield the channel region 40a from light. In one example, the electrostatic discharging layer 300 is a light shielding layer that is configured to shield the channel region 40a from light from a back light of a display apparatus having the present array substrate.

In some embodiments, the plurality of thin film transistors 100 are a plurality of top-gate type thin film transistors. Referring to FIG. 1, the array substrate in some embodiments further includes a gate insulating layer 50 on a side of the semiconductor layer 400 distal to the base substrate 10; and a gate electrode layer 60 on a side of the gate insulating layer 50 distal to the semiconductor layer 400. The insulating layer 20 is on a side of the semiconductor layer 400 proximal to the base substrate 10, and the electrostatic discharging layer 300 is on a side of the insulating layer 20 proximal to the base substrate 10. Optionally, the gate insulating layer 50 includes a plurality of gate insulating blocks respectively on the channel regions of the plurality of active layers 40. Optionally, the gate electrode layer 60 includes a plurality of gate electrodes respectively on a side of the gate insulating layer 50 distal to the channel regions of the plurality of active layers 40. The array substrate further includes an interlayer dielectric layer 70 on a side of the gate electrode layer 60 distal to the semiconductor layer 400; and a source-drain electrode layer 800 on a side of the interlayer dielectric layer 70 distal to the base substrate 10. The source-drain electrode layer 800 includes a plurality of source electrodes 80a respectively for the plurality of thin film transistors 100 and a plurality of drain electrodes 80b respectively for the plurality of thin film transistors 100. Each of the plurality of source electrodes 80a is electrically connected to one of the plurality of active layers 40, e.g., in the source electrode contact region 40b. Each of the plurality of drain electrodes 80b is electrically connected to one of the plurality of active layers 40, e.g., in the drain electrode contact region 40c.

In an array substrate having a top-gate type thin film transistor as shown in FIG. 1, the electrostatic discharging layer 300 is on a side of the semiconductor layer 400 distal to the source-drain electrode layer 800 and the gate electrode layer 60. Thus, in the fabrication process of the array substrate, the electrostatic discharging layer 300 is formed prior to the formation of the semiconductor layer 400, the source-drain electrode layer 800, and the gate electrode layer 60. By having the electrostatic discharging layer 300, electrostatic charges in the semiconductor layer 400 can be quickly and effectively dissipated. Damages caused by electrostatic charges accumulated in the semiconductor layer 400 (e.g., during the fabrication process of the array substrate) as observed in the conventional process can be avoided by having the electrostatic discharging layer 300.

Any appropriate conductive materials may be used for making the electrostatic discharging layer 300. Optionally, the electrostatic discharging layer 300 is made of a metal or an alloy. Optionally, the electrostatic discharging layer 300 also functions as a light shielding layer configured to shield the channel region 40a from light, e.g., light from a back light of a display apparatus having the present array substrate. Examples of materials for making the electrostatic discharging layer 300 include, but are not limited to, molybdenum, aluminum, copper, chromium, tungsten, titanium, tantalum, and alloys or laminates containing the same. Optionally, the electrostatic discharging layer 300 has a thickness in the range of approximately 200 nm to approximately 300 nm.

Any appropriate semiconductor materials may be used for making, the semiconductor layer 400. Optionally, the semiconductor layer 400 is made of a silicon material such as a polycrystalline silicon or an amorphous silicon. Optionally, the semiconductor layer 400 is made of a metal oxide semiconductor material. Examples of appropriate metal oxides for making the semiconductor layer 400 include, but are not limited to, indium gallium zinc oxide, indium tin zinc oxide, hafnium indium zinc oxide, indium zinc oxide, amorphous indium zinc oxide, and so on. To enhance the ohmic contact between the semiconductor layer 400 and the electrostatic discharging layer 300, the semiconductor layer 400 is optionally made of a metal oxide having a relatively lower oxygen content such as indium gallium zinc oxide. For example, the metal oxide may be a metal oxide having a lower oxygen content than an oxide having a stoichiometric composition.

Optionally, the electrostatic discharging layer 300 is in a display area of the array substrate. Optionally, the electrostatic discharging layer 300 is in a peripheral area of the array substrate. As used herein, the term "display area" refers to an area of the array substrate where image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting diode display. An inter-subpixel region refers to a region between adjacent subpixel regions, such as a region corresponding to a black matrix in a liquid crystal display or a region corresponding a pixel definition layer in an organic light emitting diode display. Optionally, the inter-subpixel region is a region between adjacent subpixel regions in a same pixel. Optionally, the inter-subpixel region is a region between two adjacent subpixel regions from two adjacent pixels. As used herein the term "peripheral area" refers to an area in the array substrate other than the display area. Optionally, the peripheral area is an area of an array substrate where various circuits and wires are provided to transmit signals to the array substrate. To increase the transparency of the display apparatus, non-transparent or opaque components of the display apparatus (e.g., battery, printed circuit board, metal frame), can be disposed in the peripheral area rather than in the display area.

In another aspect, the present disclosure provides a method of fabricating an array substrate having a plurality of thin film transistors. In some embodiments, the method includes forming a semiconductor layer on the base substrate, the semiconductor layer being formed to include a plurality of active layers respectively for the plurality of thin film transistors; and forming an electrostatic discharging layer electrically connected to the semiconductor layer and configured to discharge electrostatic charge in the semiconductor layer. Optionally, the step of forming the electrostatic discharging layer includes forming a plurality of electrostatic discharging blocks, each of the plurality of electrostatic discharging blocks being formed to be electrically connected to one of the plurality of active layers.

In some embodiments, the method further includes forming an insulating layer; and forming a plurality of vias extending through the insulating layer. Optionally, the insulating layer is formed between the semiconductor layer and the electrostatic discharging layer. Optionally, each of the plurality of active layers is formed to be electrically connected to one of the plurality of electrostatic discharging blocks through one of the plurality of vias extending through the insulating layer.

In some embodiments, each of the plurality of active layers is formed to include a channel region, a source electrode contact region, and a drain electrode contact region. Optionally, the method further includes forming a source-drain electrode layer having a plurality of source electrodes respectively for the plurality of thin film transistors and a plurality of drain electrodes respectively for the plurality of thin film transistors. Each of the plurality of source electrodes is electrically connected to the source electrode contact region. Each of the plurality of drain electrodes is electrically connected to the drain electrode contact region. Optionally, each of the plurality of electrostatic discharging blocks is electrically connected to a region in one of the plurality of active layers that is outside the channel region. In one example, each of the plurality of electrostatic discharging blocks is electrically connected to the source electrode contact region. In another example, each of the plurality of electrostatic discharging blocks is electrically connected to the drain electrode contact region.

Optionally, the electrostatic discharging layer is formed so that a projection of each of the plurality of electrostatic discharging blocks on the base substrate substantially covers a projection of the channel region in one of the plurality of active layers. Optionally, the electrostatic discharging layer is made of a light shield material for shielding the channel region in one of the plurality of active layers from light, e.g., light from a back light in a display apparatus having the array substrate fabricated according to the present method.

In some embodiments, the thin film transistors in the array substrate are top-gate type thin film transistors. Optionally, the method further includes forming a gate insulating layer on a side of the semiconductor layer distal to the base substrate; and forming a gate electrode layer on a side of the gate insulating layer distal to the semiconductor layer. The insulating layer is formed on a side of the semiconductor layer proximal to the base substrate. The electrostatic discharging layer is formed on a side of the insulating layer proximal to the base substrate.

In some embodiments, the method further includes forming an interlayer dielectric layer on a side of the gate electrode layer distal to the semiconductor layer; and forming a source-drain electrode layer on a side of the interlayer dielectric layer distal to the base substrate. Optionally, the step of forming the source-drain electrode layer includes forming a plurality of source electrodes respectively for the plurality of thin film transistors and a plurality of drain electrodes respectively for the plurality of thin film transistors. Each of the plurality of source electrodes is formed to be electrically connected to one of the plurality of active layers. Each of the plurality of drain electrodes is formed to be electrically connected to one of the plurality of active layers.

Optionally, the electrostatic discharging layer is formed in a display area of the array substrate. Optionally, the electrostatic discharging layer is formed in a peripheral area of the array substrate.

Figure 4A:
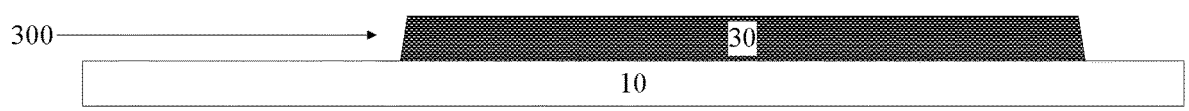
FIGS. 4A-4G illustrate a process of fabricating an array substrate in some embodiments according to the present disclosure.

FIGS. 4A-4G illustrate a process of fabricating an array substrate in some embodiments according to the present disclosure. Referring to FIG. 4A, an electrostatic discharging layer 300 is first formed on a base substrate 10. The electrostatic discharging layer 300 includes a plurality of electrostatic discharging blocks 30 (also serves as a light shielding layer for the thin film transistor). Each of the plurality of electrostatic discharging blocks 30 may be floating. Optionally, each of the plurality of electrostatic discharging blocks 30 is connected to ground.

Figure 4B:
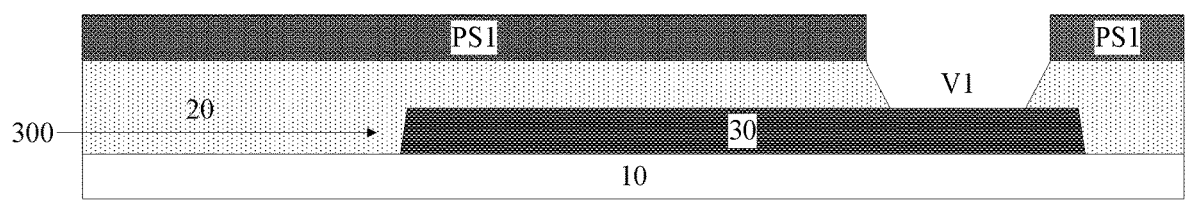

Referring to FIG. 4B, an insulating layer 20 is formed on a side of the electrostatic discharging layer 300 distal to the base substrate 10. A first photoresist layer PS1 is formed on a side of the insulating layer 20 distal to the base substrate 10. In one example, the first photoresist layer PS1 is formed by forming a photoresist material layer on a side of the insulating layer 20 distal to the base substrate 10, exposing the photoresist material layer using a mask, developing the exposed photoresist material layer to obtain a photoresist pattern having a first section and a second section. The first section corresponds to a plurality of first vias V1 to be formed in subsequent steps to extend through the insulating layer 20. The second section is outside the first section. Optionally, the insulating layer 20 is formed by etching the insulating material in a region corresponding to the plurality of first vias V1. Optionally, the etching step is performed by a dry etching process.

Figure 4C:
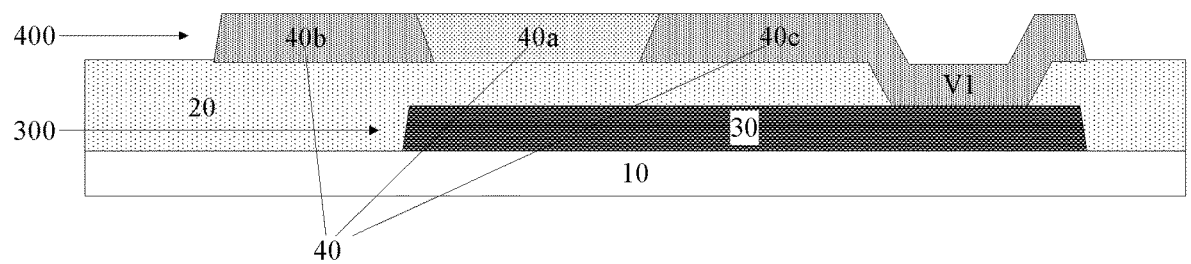

Referring to FIG. 4C, a semiconductor layer 400 is then formed on a side of the insulating layer 20 distal to the base substrate 10. The semiconductor layer 400 includes a plurality of active layers 40. Each of the plurality of active layers 40 includes a channel region 40a, a source electrode contact region 40b, and a drain electrode contact region 40c. As shown in FIG. 4C, the drain electrode contact region 40c is electrically connected to one of the plurality of electrostatic discharging blocks 30 through one of the plurality of first vias V1. The semiconductor material of the semiconductor layer 400 fills in the one of the plurality of first vias V1 and forms ohmic contact with the one of the plurality of electrostatic discharging blocks 30. A projection of the one of the plurality of electrostatic discharging blocks 30 on the base substrate 10 substantially covers a projection of the channel region 40a on the base substrate 10. Thus, the one of the plurality of electrostatic discharging blocks 30 also serves as a light shielding layer configured to shield the channel region 40a from light.

Figure 4D:
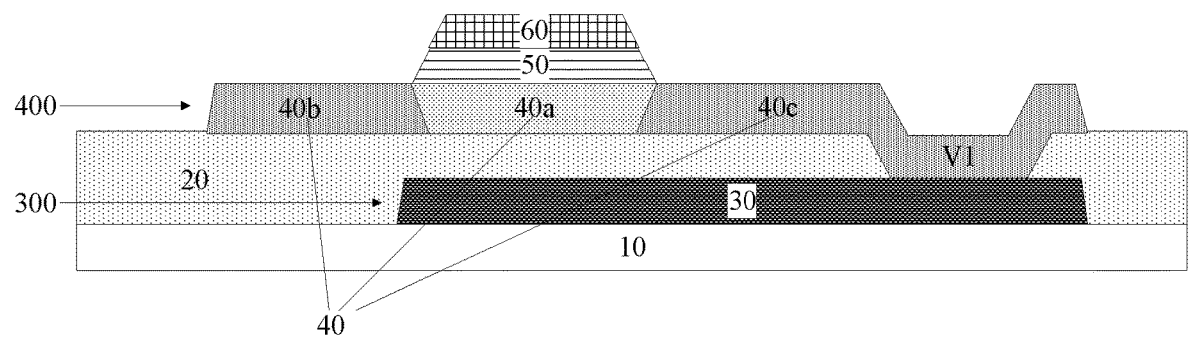
Figure 4E:
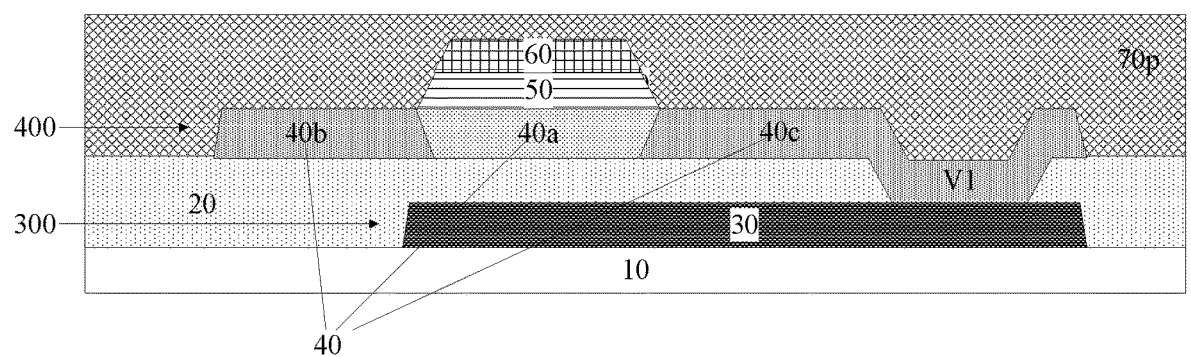
Figure 4F:
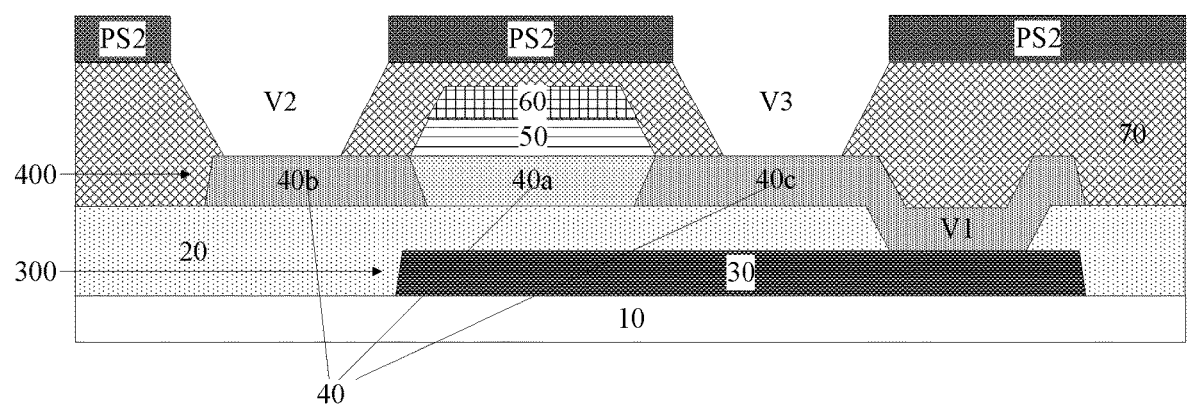

Referring to FIG. 4D, subsequent to the formation of the semiconductor layer 400, a gate insulating layer 50 is formed on a side of the channel region 40a distal to the insulating layer 20, and a gate electrode layer 60 is formed on a side of the gate insulating layer 50 distal to the channel region 40a. Referring to FIG. 4E, subsequent to the formation of the gate electrode layer 60, an insulating material layer 70p is formed on a side of the gate electrode layer 60 distal to the base substrate 10. Referring to FIG. 4F, a second photoresist layer PS2 is then formed for patterning the insulating material layer 70p into an interlayer dielectric layer 70. In one example, the second photoresist layer PS2 is formed by forming a photoresist material layer on a side of the insulating material layer 70p distal to the base substrate 10, exposing the photoresist material layer using a mask, developing the exposed photoresist material layer to obtain a photoresist pattern having a first section and a second section. The first section corresponds to a plurality of second vias V2 and a plurality of third vias V3 to be formed in subsequent steps to extend through the interlayer dielectric layer 70. The second section is outside the first section. Optionally, the interlayer dielectric layer 70 is formed by etching the insulating material in a region corresponding to the plurality of second vias V2 and the plurality of third vias V3. Optionally, the etching step is performed by a dry etching process.

During the photoresist lithography processes, electrostatic charges are generated (e.g., by exposure to the UV radiation for forming the photoresist pattern) and accumulated in the semiconductor layer 400. If these electrostatic charges are not dissipated and accumulated to a certain level, they will be discharged to nearby metallic signal lines such as a gate line (in a same layer as the gate electrode layer 60), damaging these signal lines. The electrostatic discharging also causes damages to the semiconductor layer 400 itself deteriorating electrical properties of the active layer. By having an electrostatic discharging layer 300, the electrostatic charges generated during the photoresist lithography processes can be quickly and effectively dissipated to the electrostatic discharging layer 300, avoiding damages to the nearby signal lines.

Figure 4G:
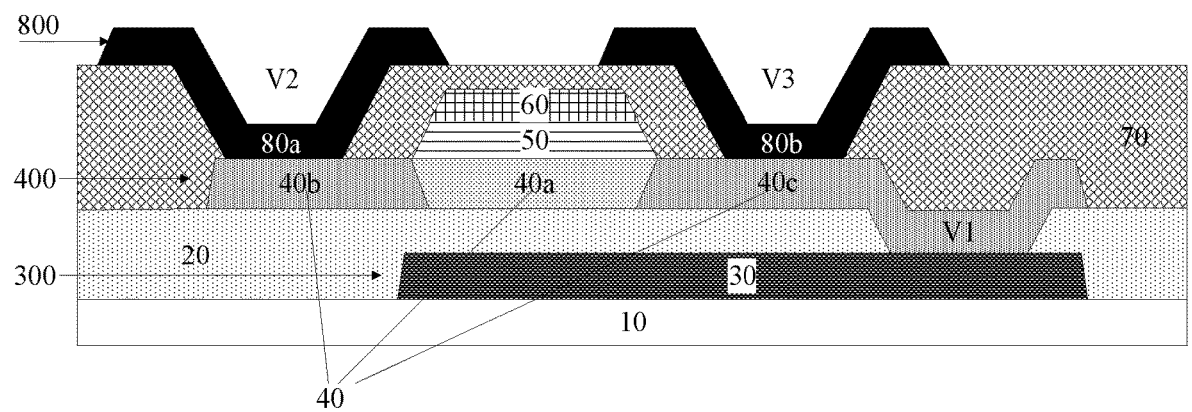

Referring to FIG. 4G, subsequent to the formation of the plurality of second vias V2 and the plurality of third vias V3, the second photoresist layer PS2 is removed, and a source-drain electrode layer 800 is formed on a side of the interlayer dielectric layer 70 distal to the base substrate 10. The source-drain electrode layer 800 is formed to include a plurality of source electrodes 80a respectively for the plurality of thin film transistors 100 and a plurality of drain electrodes 80b respectively for the plurality of thin film transistors 100. Each of the plurality of source electrodes 80a is electrically connected to one of the plurality of active layers 40, e.g., in the source electrode contact region 40b, through one of the plurality of second vias V2. Each of the plurality of drain electrodes 80b is electrically connected to one of the plurality of active layers 40, e.g., in the drain electrode contact region 40c, through one of the plurality of third vias V3.

Referring to FIG. 1, subsequent to the formation of the source-drain electrode layer 800, a passivation layer 90 is formed on a side of the source-drain electrode layer 800 distal to the base substrate 10.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified, by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate having a plurality of thin film transistors, comprising:
   a base substrate;
   a semiconductor layer on the base substrate and comprising a plurality of active layers respectively for the plurality of thin film transistors;
   an electrostatic discharging layer electrically connected to the semiconductor layer and configured to discharge electrostatic charge in the semiconductor layer;
   an insulating layer between the semiconductor layer and the electrostatic discharging layer;
   a gate insulating layer on a side of the semiconductor layer distal to the base substrate; and
   a gate electrode layer on a side of the gate insulating layer distal to the semiconductor layer;
   wherein the electrostatic discharging layer comprises a plurality of electrostatic discharging blocks;

a respective one of the plurality of active layers is electrically connected to one of the plurality of electrostatic discharging blocks;
the respective one of the plurality of active layers is electrically connected to one of the plurality of electrostatic discharging blocks through a via extending through the insulating layer;
the insulating layer is on a side of the semiconductor layer proximal to the base substrate; and
the electrostatic discharging layer is on a side of the insulating layer proximal to the base substrate.

2. The array substrate of claim 1, wherein the respective one of the plurality of active layers comprises a channel region, a source electrode contact region, and a drain electrode contact region;
wherein a respective one of the plurality of electrostatic discharging blocks is electrically connected to a region in one of the plurality of active layers that is outside the channel region.

3. The array substrate of claim 2, wherein a projection of the respective one of the plurality of electrostatic discharging blocks on the base substrate substantially covers a projection of the channel region in one of the plurality of active layers on the base substrate.

4. The array substrate of claim 3, wherein the respective one of the plurality of electrostatic discharging blocks is a light shielding layer for shielding the channel region in one of the plurality of active layers from light.

5. The array substrate of claim 1, further comprising:
an interlayer dielectric layer on a side of the gate electrode layer distal to the semiconductor layer; and
a source-drain electrode layer on a side of the interlayer dielectric layer distal to the base substrate;
wherein the source-drain electrode layer comprises a plurality of source electrodes respectively for the plurality of thin film transistors and a plurality of drain electrodes respectively for the plurality of thin film transistors;
a respective one of the plurality of source electrodes is electrically connected to one of the plurality of active layers; and
a respective one of the plurality of drain electrodes is electrically connected to one of the plurality of active layers.

6. The array substrate of claim 1, wherein the electrostatic discharging layer comprises a metal or alloy.

7. The array substrate of claim 1, wherein the electrostatic discharging layer is in a display area of the array substrate.

8. A display apparatus, comprising the array substrate of claim 1.

9. A method of fabricating an array substrate having a plurality of thin film transistors, comprising:
forming a semiconductor layer on a base substrate, the semiconductor layer being formed to comprise a plurality of active layers respectively for the plurality of thin film transistors;
forming an electrostatic discharging layer electrically connected to the semiconductor layer and configured to discharge electrostatic charge in the semiconductor layer;
forming an insulating layer;
forming a gate insulating layer on a side of the semiconductor layer distal to the base substrate; and
forming a gate electrode layer on a side of the gate insulating layer distal to the semiconductor layer; and
forming a plurality of vias extending through the insulating layer;
wherein the insulating layer is formed between the semiconductor layer and the electrostatic discharging layer;
forming the electrostatic discharging layer comprises forming a plurality of electrostatic discharging blocks;
a respective one of the plurality of active layers is formed to be electrically connected to one of the plurality of electrostatic discharging blocks through one of the plurality of vias extending through the insulating layer;
the insulating layer is formed on a side of the semiconductor layer proximal to the base substrate; and
the electrostatic discharging layer is formed on a side of the insulating layer proximal to the base substrate.

10. The method of claim 9, wherein the respective one of the plurality of active layers is formed to comprise a channel region, a source electrode contact region, and a drain electrode contact region; and
a respective one of the plurality of electrostatic discharging blocks is electrically connected to a region in one of the plurality of active layers that is outside the channel region.

11. The method of claim 10, wherein the electrostatic discharging layer is formed so that a projection of the respective one of the plurality of electrostatic discharging blocks on the base substrate substantially covers a projection of the channel region in one of the plurality of active layers on the base substrate.

12. The method of claim 11, wherein the electrostatic discharging layer is made of a light shield material for shielding the channel region in one of the plurality of active layers from light.

13. The method of claim 9, further comprising:
forming an interlayer dielectric layer on a side of a gate electrode layer distal to the semiconductor layer; and
forming a source-drain electrode layer on a side of the interlayer dielectric layer distal to the base substrate;
wherein the source-drain electrode layer is formed to comprise a plurality of source electrodes respectively for the plurality of thin film transistors and a plurality of drain electrodes respectively for the plurality of thin film transistors;
a respective one of the plurality of source electrodes is formed to be electrically connected to one of the plurality of active layers; and
a respective one of the plurality of drain electrodes is formed to be electrically connected to one of the plurality of active layers.

14. The method of claim 9, wherein the electrostatic discharging layer is made of a metal or alloy.

* * * * *